United States Patent
Singhai et al.

(10) Patent No.: US 11,579,973 B2
(45) Date of Patent: Feb. 14, 2023

(54) METHODS AND SYSTEMS FOR IMPLEMENTING REDUNDANCY IN MEMORY CONTROLLERS

(71) Applicant: Western Digital Technologies, Inc., San Jose, CA (US)

(72) Inventors: Ashish Singhai, Los Altos, CA (US); Ashwin Narasimha, Los Altos, CA (US); Kenneth Alan Okin, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/463,340

(22) Filed: Aug. 31, 2021

(65) Prior Publication Data

US 2021/0390017 A1   Dec. 16, 2021

Related U.S. Application Data

(60) Continuation of application No. 16/818,949, filed on Mar. 13, 2020, now Pat. No. 11,132,255, which is a
(Continued)

(51) Int. Cl.
  *G06F 11/10* (2006.01)
  *G11C 29/00* (2006.01)

(52) U.S. Cl.
  CPC ........ *G06F 11/1068* (2013.01); *G06F 11/108* (2013.01); *G11C 29/765* (2013.01)

(58) Field of Classification Search
  CPC .. G06F 11/1068; G06F 11/108; G11C 29/765; H03M 13/11
  See application file for complete search history.

(56) References Cited

U.S. PATENT DOCUMENTS

| | | |
|---|---|---|
| 7,111,228 B1 | 9/2006 | Ricci |
| 7,577,804 B2 | 8/2009 | Vageline et al. |

(Continued)

FOREIGN PATENT DOCUMENTS

WO   WO 2013/023564   2/2013

OTHER PUBLICATIONS

H. C. Chiang, M. Y. Wang and C. W. Wu, "DRAM System Simulation Speed-Up by Effective-Cycle Selection," 2014 International Symposium on Computer, Consumer and Control, Taichung, Taiwan, 2014, pp. 1053-1056. (Year: 2014).*

(Continued)

*Primary Examiner* — Cynthia Britt
(74) *Attorney, Agent, or Firm* — Morgan, Lewis & Bockius LLP

(57) ABSTRACT

The present disclosure relates to methods and systems for implementing redundancy in memory controllers. The disclosed systems and methods utilize a row of memory blocks, such that each memory block in the row is associated with an independent media unit. Failures of the media units are not correlated, and therefore, a failure in one unit does not affect the data stored in the other units. Parity information associated with the data stored in the memory blocks is stored in a separate memory block. If the data in a single memory block has been corrupted, the data stored in the remaining memory blocks and the parity information is used to retrieve the corrupted data.

20 Claims, 6 Drawing Sheets

Related U.S. Application Data continuation of application No. 16/164,730, filed on Oct. 18, 2018, now Pat. No. 10,628,260, which is a division of application No. 15/484,039, filed on Apr. 10, 2017, now Pat. No. 10,133,629, which is a division of application No. 14/564,798, filed on Dec. 9, 2014, now Pat. No. 9,619,326.

(56) References Cited

U.S. PATENT DOCUMENTS

| | | | |
|---|---|---|---|
| 7,689,869 | B2 | 3/2010 | Terashita |
| 8,327,224 | B2 | 12/2012 | Larsen et al. |
| 8,438,455 | B2 | 5/2013 | Vogan et al. |
| 8,650,463 | B2 | 2/2014 | Lim et al. |
| 8,677,203 | B1* | 3/2014 | Shalvi .................. G06F 3/0655 |
| | | | 714/747 |
| 8,762,810 | B2 | 6/2014 | Otsuka et al. |
| 8,832,528 | B2* | 9/2014 | Thatcher .......... H03M 13/6502 |
| | | | 714/766 |
| 9,852,681 | B2* | 12/2017 | Song .................. G09G 3/3208 |
| 2006/0136777 | A1 | 6/2006 | Terashita et al. |
| 2006/0200720 | A1* | 9/2006 | Grimme .............. G06F 13/4234 |
| | | | 714/738 |
| 2008/0273400 | A1 | 11/2008 | La Rosa et al. |
| 2009/0235014 | A1 | 9/2009 | Yim et al. |
| 2009/0287956 | A1* | 11/2009 | Flynn .................. G06F 11/1008 |
| | | | 714/48 |
| 2010/0100763 | A1 | 4/2010 | Chen |
| 2011/0161779 | A1 | 6/2011 | Otsuka et al. |
| 2011/0191649 | A1 | 8/2011 | Lim et al. |
| 2012/0084504 | A1 | 4/2012 | Colgrove et al. |
| 2013/0304970 | A1 | 11/2013 | Parizi |
| 2014/0108884 | A1 | 4/2014 | Shu et al. |
| 2014/0129874 | A1 | 5/2014 | Zaltsman et al. |
| 2014/0237287 | A1* | 8/2014 | Burd .................. G06F 11/1008 |
| | | | 714/6.24 |
| 2015/0095737 | A1 | 4/2015 | Grimsrud et al. |
| 2016/0162356 | A1 | 6/2016 | Singhai et al. |

OTHER PUBLICATIONS

Intel Solid-State Drive DC S3700 Datacenter RAS Features, Technical Brief, Order No. 327805-001US, Oct. 2012, 11 pages.

Lin et al., "A NAND Flash Memory Controller for SD/MMC Flash Memory Card," in IEEE Transactions on Magnetics, vol. 43, No. 2, pp. 933-935, Feb. 2007.

Shadley, "NAND Flash Media Management Through RAIN," Micron Technology, Inc., Technical Marketing Brief, pp. 1-7 (2011).

Skoncej, "WBR—word- and block-level hard error repair for memories," 2012 12th Annual Non-Volatile Memory Technology Symposium Proceedings, Singapore, 2012, pp. 41-46.

Tanakamaru et al., "NANO Flash Memory/ReRAM Hybrid Unified Solid-State-Storage Architecture," in IEEE Transactions on Circuits and Systems I: Regular Papers, vol. 61, No. 4, pp. 1119-1132, Apr. 2014.

Xie et al., "Applying transparent lossless data compression to improve the feasibility of using advanced error correction codes in solid-state drives," 2010 IEEE Workshop on Signal Processing Systems, San Francisco, California, pp. 31-35 (2010).

\* cited by examiner

METHODS AND SYSTEMS FOR IMPLEMENTING REDUNDANCY IN MEMORY CONTROLLERS

CROSS-REFERENCE TO RELATED APPLICATIONS

This application is a continuation of application Ser. No. 16/818,949, filed on Mar. 13, 2020, now U.S. Pat. No. 11,132,255, which is a continuation of application Ser. No. 16/164,730, filed on Oct. 18, 2018, now U.S. Pat. No. 10,628,260, which is a divisional of application Ser. No. 15/484,039, filed on Apr. 10, 2017, now U.S. Pat. No. 10,133,629, which is a divisional of application Ser. No. 14/564,798, filed on Dec. 9, 2014, now U.S. Pat. No. 9,619,326, the entirety of each of which is incorporated herein by reference for all purposes.

FIELD OF THE DISCLOSURE

The present disclosure relates to systems and methods for implementing redundancy in memory controllers.

BACKGROUND

In non-volatile memory based storage devices, such as, NAND flash, phase-change memory (PCM), magnetoresistive RAM (MRAM) or resistive RAM (RRAM or ReRAM) based storage devices, data layout must incorporate redundancy so that failure of a media unit, for example, a flash chip, or failure to reach a media unit, for example, when the connection to the media unit is broken, is tolerated in the system and data remains available.

One approach for implementing redundancy is using exclusive-OR ("XOR") based parity. According to this approach, data blocks of identical size stored across multiple, independent storage units are XOR'ed to produce a parity block that is stored in a separate media unit. This approach tolerates the failure of one media unit. By XOR'ing the data from the remaining units and the data in the parity block, the data stored in the failed unit can be reconstructed.

Implementing XOR-based redundancy in Non-Volatile Memory (NVM), for example, PCMs, ReRAMs and MRAMs, solid state drives ("SSD") is especially challenging due to NVM memory characteristics, high performance requirements, requirement to store data consistently in the event of a power loss and space efficiency constraints.

Accordingly, there is a need for an XOR-based parity scheme that meets requirements for high throughput, low latency, flexibility, low space overhead, and robustness against unexpected power loss.

SUMMARY

Methods and systems for implementing redundancy in memory controllers are presented. The disclosed systems and methods utilize a row of memory blocks (storage elements) associated with an independent media unit. Parity information associated with the data stored in the memory blocks is stored in a separate memory block. If the data in a single memory block has been corrupted, the data stored in the remaining memory blocks and the parity information is used to retrieve the corrupted data.

According to aspects of the present disclosure, a method for introducing redundancy in a memory controller is provided. The method can include providing a plurality of data memory elements, each data memory element being associated with a corresponding non-volatile storage element, the plurality of data memory elements including a parity data memory element, and a control memory element comprising a plurality of entries, each entry corresponding to a data memory element from the plurality of data memory elements. The method can also include initializing the plurality of entries of the control memory element to a first value and storing, by the memory controller, a received first data block from a host computer to the first data memory element and, if an entry in the control memory element corresponding to the parity data memory element has the first value, to the parity data memory element. The method can also include changing to a second value an entry in the control memory element corresponding to the first data memory element and the entry in the control memory element corresponding to the parity data memory element, storing a received second data block from the host computer to a second data memory element, and storing to the parity data memory element a result of a logical operation between a value in the second data block and the value in the parity data memory element, if the entry in the control memory element corresponding to the parity data memory element has the second value.

According to aspects of the present disclosure, a method for introducing redundancy in a memory controller is provided. The method can include providing initializing a plurality of data memory elements to a logical zero value, each data memory element being associated with a corresponding non-volatile storage element, the plurality of data memory elements including a parity data memory element. The method can also include receiving, from a host computer, a first data block associated with a first data memory element and storing to the first data memory element a first result of a logical operation between a value in the first data block and a value in the first data memory element. The method can also include storing to the parity data memory element a second result of a logical operation between the value in the first data block and the value in the parity data memory element and receiving, from the host computer, a second data block associated with a second data memory element. The method can also include storing to the second data memory element a third result of a logical operation between a value in the second data block and a value in the second data memory element and storing to the parity data memory element a fourth result of a logical operation between the value in the second data block and the value in the parity data memory element.

According to aspects of the present disclosure, a method for introducing redundancy in a memory controller is provided. The method can include providing a plurality of data memory elements, each data memory element being associated with a corresponding non-volatile storage element, the plurality of data memory elements including a parity data memory element and providing a control memory element comprising a plurality of entries, each entry corresponding to a data memory element from the plurality of data memory elements. The method can also include initializing the plurality of entries of the control memory element to a first value, receiving, from a host computer, a first data block associated with a first data memory element, storing the received first data block to the first data memory element, and storing the received first data block to the parity data memory element, if an entry in the control memory element corresponding to the parity data memory element has the first value. The method can also include changing to a second value an entry in the control memory element corresponding to the first data memory element and changing to the second value the entry in the control memory element corresponding to the parity data memory element. The method can also include receiving, from the host computer, a second data block associated with a second data memory element, storing, by the memory controller, the received second data block to the second data memory element, performing a logical operation between a value in the second data block and the value in the parity data memory element, if the entry in the control memory element corresponding to the parity data memory element has the second value, and storing, by the memory controller, the result of the logical operation to the parity data memory element, if the entry in the control memory element corresponding to the parity data memory element has the second value. The method can also include transferring the stored data from the data memory elements to their corresponding non-volatile storage elements and initializing the data memory elements to a logical zero, after transferring the stored data from the data memory elements to the first non-volatile storage elements.

According to aspects of the present disclosure, a method for introducing redundancy in a memory controller is provided. The method can include providing a plurality of data memory elements, each data memory element being associated with a corresponding non-volatile storage element, the plurality of data memory elements including a parity data memory element and initializing the plurality of data memory elements to a logical zero value. The method can also include receiving, from a host computer, a first data block associated with a first data memory element, performing a logical operation between a value in the first data block and a value in the first data memory element, and storing the result of the logical operation to the first data memory element. The method can also include performing the logical operation between the value in the first data block and the value in the parity data memory element and storing the result of the logical operation to the parity data memory element. The method can also include receiving, from the host computer, a second data block associated with a second data memory element, performing the logical operation between a value in the second data block and a value in the second data memory element, and storing the result of the logical operation to the second data memory element. The method can also include performing the logical operation between the value in the second data block and the value in the parity data memory element and storing the result of the logical operation to the parity data memory element. The method can also include transferring the stored data from the data memory elements to their corresponding non-volatile storage elements and initializing the data memory elements to a logical zero, after transferring the stored data from the data memory elements to the first non-volatile storage elements.

According to aspects of the present disclosure, a memory controller is provided. The memory controller can include a plurality of data memory elements, each data memory element being associated with a corresponding non-volatile storage element, the plurality of data memory elements including a parity data memory element, a control memory element comprising a plurality of entries, each entry corresponding to a data memory element from the plurality of data memory elements, and a controller module. The controller module can be configured to initialize the plurality of entries of the control memory element to a first value, store a received first data block from a host computer to the first data memory element and, if an entry in the control memory element corresponding to the parity data memory element has the first value, to the parity data memory element, and change to a second value an entry in the control memory element corresponding to the first data memory element and the entry in the control memory element corresponding to the parity data memory element. The controller module can be configured to store a received second data block from the host computer to a second data memory element and store to the parity data memory element a result of a logical operation between a value in the second data block and the value in the parity data memory element, if the entry in the control memory element corresponding to the parity data memory element has the second value.

According to aspects of the present disclosure, a memory controller is provided. The memory controller can include a plurality of data memory elements, each data memory element being associated with a corresponding non-volatile storage element, the plurality of data memory elements including a parity data memory element. The memory controller can also include a controller module configured to initialize the plurality of data memory elements to a logical zero value, receive, from a host computer, a first data block associated with a first data memory element, store to the first data memory element a first result of a logical operation between a value in the first data block and a value in the first data memory element, and store to the parity data memory element a second result of a logical operation between the value in the first data block and the value in the parity data memory element. The controller module can be configured to receive, from the host computer, a second data block associated with a second data memory element, store, by the memory controller, to the second data memory element a third result of a logical operation between a value in the second data block and a value in the second data memory element, and store, by the memory controller, to the parity data memory element a fourth result of a logical operation between the value in the second data block and the value in the parity data memory element.

According to aspects of the present disclosure, a memory controller is provided. The memory controller can include a plurality of data memory elements, each data memory element being associated with a corresponding non-volatile storage element, the plurality of data memory elements including a parity data memory element, a control memory element comprising a plurality of entries, each entry corresponding to a data memory element from the plurality of data memory elements, and a controller module. The controller module can be configured to initialize the plurality of entries of the control memory element to a first value, receive, from a host computer, a first data block associated with a first data memory element, store the received first data block to the first data memory element, and store the received first data block to the parity data memory element, if an entry in the control memory element corresponding to the parity data memory element has the first value. The controller module can also be configured to change to a second value an entry in the control memory element corresponding to the first data memory element and change to the second value the entry in the control memory element corresponding to the parity data memory element. The controller module can also be configured to receive a second data block associated with a second data memory element, store the received second data block to the second data memory element, perform a logical operation between a value in the second data block and the value in the parity data memory element, if the entry in the control memory element corresponding to the parity data memory element has the second value, and store the result of the logical operation to the parity data memory element, if the entry in the control memory element corresponding to the parity data memory element has the second value. The controller module can also be configured to transfer the stored data from the data memory elements to their corresponding non-volatile storage elements and initialize the data memory elements to a logical zero, after transferring the stored data from the data memory elements to the first non-volatile storage elements.

According to aspects of the present disclosure, a memory controller is provided. The memory controller can include a plurality of data memory elements, each data memory element being associated with a corresponding non-volatile storage element, the plurality of data memory elements including a parity data memory element. The memory controller can also include a controller module configured to initialize the plurality of data memory elements to a logical zero value, receive, from a host computer, a first data block associated with a first data memory element, perform a logical operation between a value in the first data block and a value in the first data memory element, and store the result of the logical operation to the first data memory element. The controller module can also be configured to perform the logical operation between the value in the first data block and the value in the parity data memory element and store the result of the logical operation to the parity data memory element. The controller module can also be configured to receive a second data block associated with a second data memory element, perform the logical operation between a value in the second data block and a value in the second data memory element, and store the result of the logical operation to the second data memory element. The controller module can also be configured to perform the logical operation between the value in the second data block and the value in the parity data memory element and store the result of the logical operation to the parity data memory element. The controller module can also be configured to transfer the stored data from the data memory elements to their corresponding non-volatile storage elements and initialize the data memory elements to a logical zero, after transferring the stored data from the data memory elements to the first non-volatile storage elements.

BRIEF DESCRIPTION OF THE DRAWINGS

Various objects, features, and advantages of the present disclosure can be more fully appreciated with reference to the following detailed description when considered in connection with the following drawings, in which like reference numerals identify like elements. The following drawings are for the purpose of illustration only and are not intended to be limiting of the invention, the scope of which is set forth in the claims that follow.

DETAILED DESCRIPTION

Figure 1:
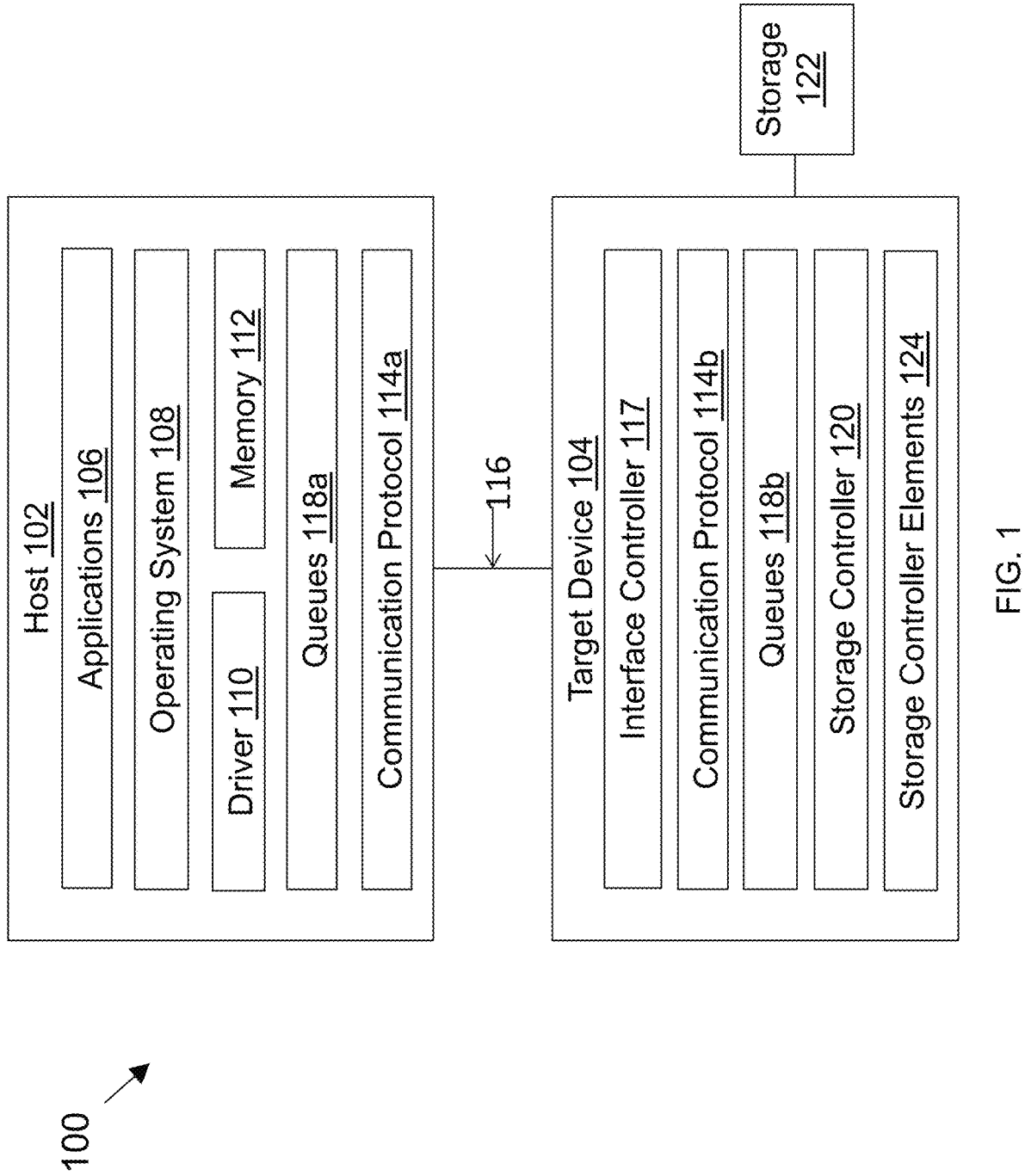
FIG. 1 illustrates an exemplary system implementing a communication protocol, in accordance with embodiments of the present disclosure.

FIG. 1 shows an illustrative system 100 implementing a communication protocol, in accordance with some embodiments of the present disclosure. System 100 includes host 102 in communication with target device 104 and storage 122. Host 102 includes user applications 106, operating system 108, driver 110, host memory 112, queues 118a, and communication protocol 114a. Target device 104 includes interface controller 117, communication protocol 114b, queues 118b, and storage controller 120 and storage controller elements 124 in communication with storage 122.

Host 102 can run user-level applications 106 on operating system 108. Operating system 108 can run driver 110 that interfaces with host memory 112. In some embodiments, memory 112 can be dynamic random access memory (DRAM). Host memory 112 can use queues 118a to store commands from host 102 for target 104 to process. Examples of stored or enqueued commands can include read operations from host 102. Communication protocol 114a can allow host 102 to communicate with target device 104 using interface controller 117.

Target device 104 can communicate with host 102 using interface controller 117 and communication protocol 114b. Communication protocol 114b can provide queues 118 to access storage 122 via storage controller 120. According to aspects of the present disclosure, data flows from the host memory 112, into the storage controller elements 124, and then into storage 122. The disclosed systems and methods implement redundancy when storing and retrieving data via target device 104.

According to aspects of the present disclosure, a number of memory blocks, for example, "n" memory blocks, form a row of memory blocks, such that each memory block in the row is associated with an independent media unit. Accordingly, failures of these media units are not correlated, and therefore, a failure in one unit does not affect the data stored in the other units. This is typically the case in a flash-based SSD where a flash chip can fail, in part or in whole, independently of other flash chips.

Figure 2:
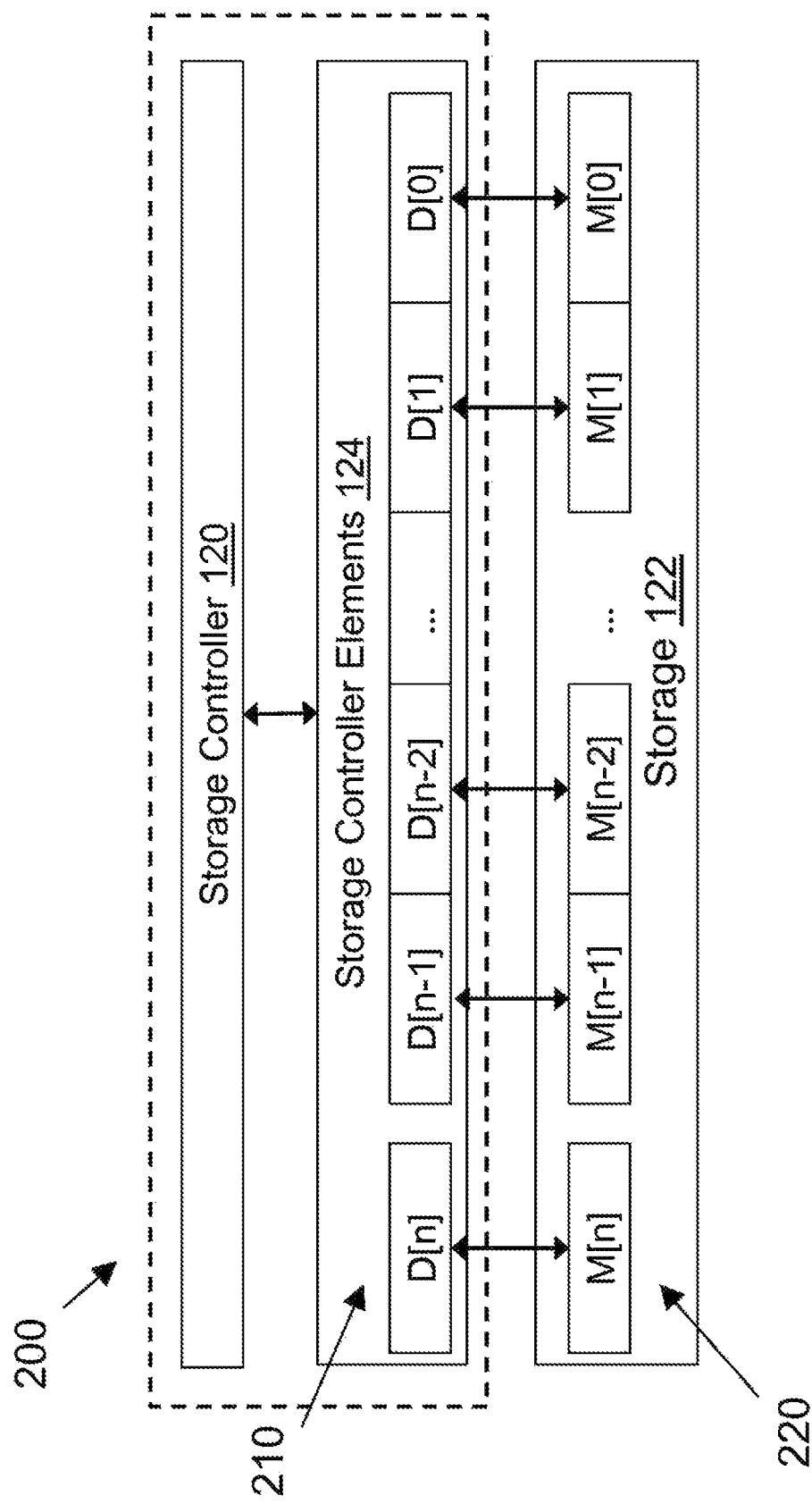
FIG. 2 illustrates an exemplary system implementing a redundancy scheme protocol, in accordance with embodiments of the present disclosure.

FIG. 2 shows an illustration of a system according to aspects of the present disclosure. Specifically, system 200 shows storage controller 120 and storage controller elements 124. Storage controller elements 124 implement memory blocks 210. System 200 also shows storage 122, which includes memory units 220. As discussed above, memory units 220 can be independent media units. The data stored in the various memory blocks in a row, for example, "n" memory blocks, can be named D[0] through D[n−1]. According to aspects of the present disclosure, an XOR-based parity scheme distributes the data across the row of "n" memory blocks 210, such that failure of any one memory unit 220 does not hinder access to the data stored in the corresponding row, e.g., the row formed by memory blocks D[0]-D[n−1]. The parity information can be stored at a parity memory block, D[n], as: D[n]=XOR(D[0], . . . D[n−1]). Specifically, as each D[i] is received ($0 \leq i \leq n-1$), the parity bits in the parity memory block, D[n], are updated. Therefore, as explained in detail below, elements D[0] . . . D[n−1] are filled spatially, while element D[n] sees repeated data items arriving into it.

An illustrative data recovery in the case of failure of one media unit is as follows: suppose memory M[i] has failed and data D[i] is inaccessible. Data D[i] can be reconstructed by XOR-ing the data from the rest of the memory blocks (including the parity data), as follows: D[i]=XOR(D[0] . . . D[i−1], D[i+1], . . . D[n−1], D[n]).

Efficient implementation of this scheme, however, poses multiple challenges as described below.

Incremental Construction

A first challenge relates to the ability for incremental construction of parity information. Specifically, all data belonging to a row may not be simultaneously presented by the application. The implementation should be capable of storing data of only a subset of the memory blocks in the row, without requiring that the rest of the row's data be also available. Accordingly, the implementation should allow the parity bits to be constructed incrementally, as the data becomes available.

Concurrent Transfers

A second challenge relates to handling concurrent data transfer. Specifically, when there are multiple concurrent data writes to the memory blocks, the parity bits must correctly reflect the XOR operation of all the data that have arrived without forcing a serialization, because serialization will decrease performance.

Buffered Construction

A third challenge relates to concurrent data transfers. In case of block addressable memories, a block of data, e.g., 16 KB, needs to be presented to the memory as a single unit. This is also applicable to the memory hosting the parity data, D[n] which is updated for each D[i] as it arrives. Hence, element D[n] needs to be ready before it can be written to the non-volatile memory. This may require buffered construction, which may result in data corruption, if the write operation is interrupted before all data in the block is written. An example of data corruption because of interruption of the write operation is the "RAID 5 Write Hole" phenomenon. Accordingly, the parity bits cannot be committed to the non-volatile memory, until all the memory blocks in a row are filled. For example, when data arrives one memory block at a time, as a memory block is filled, the parity bits are updated and are expected to be reliably available in the future. However, arrival of data in another memory blocks will cause the parity bits to be updated again. Therefore, the parity bits should be held in an updatable buffer and be committed to the memory only when the entire row has been filled.

Robustness Against Power Loss

A fourth challenge relates to sudden power loss. Specifically, if the device power is suddenly lost during an update of the parity bits, the parity bits in the memory block might not reflect a consistent state. For example, some parity bits might have been updated to incorporate the latest data while other parity bits might only incorporate parity information from earlier writes, and not the latest one. This can compromise the ability to accurately recover data in the event of a future failure.

Incomplete Data Rows

A fifth challenge relates to non-complete data rows. Depending on the data arrival pattern, it is possible that a row may not be entirely filled for relatively long periods of time, or the device may be turned off in a state which contains partially filled rows. When a row is not entirely filled with valid data and a memory block that holds valid data fails, data recovery would still be required even though not all memory blocks of the row are filled. Successful data recovery in this case would require knowing how many and which memory blocks hold valid data. The memory block with the parity information holds the result of the XOR operation of the data of all memory blocks with valid data. Not knowing which memory blocks hold valid data and therefore have contributed to the parity information can lead to data corruption or inability to recover the data, which can results in data loss.

Unbalanced Data Paths

A sixth challenge relates to handling unbalanced data paths. For example, the memory block that holds the parity information receives higher data volume compared to the volume other memory blocks receive. For example, the memory block that holds the parity information can receive up to "n" times the data volume compared to the other memory blocks, because every time data is written to any of the data blocks, the data also "touches" the memory block that holds the parity information. Accordingly, the data distribution pathways should be adequately provisioned to avoid bottlenecks. Efficient implementations can use balancing, such that the volume of data received by each memory unit across the device is not significantly unbalanced.

According to aspects of the present disclosure, the memory blocks, for example, the Controller Storage Elements 124 shown in FIGS. 1 and 2, can be in one of the two states: valid or invalid. For each controller storage element, its corresponding state can be monitored using a control element called a phase bit. For example, when the phase bit of a controller storage element has a value "0" or False, then the corresponding controller memory element is in an invalid state, i.e., it does not hold valid data. When the phase bit of a controller storage element has a value "1" or True, then the corresponding controller memory element is in a valid state, i.e., it holds valid data.

According to aspects of the present disclosure, an illustrative method for transitioning from one state to another is described below. The initial value of the phase bit can be "0," signifying that the corresponding storage elements are in an invalid state. An incoming data transfer into a first storage element in an invalid state can cause the storage element to store the incoming data into the storage element, and transition the corresponding phase bit to a value of "1," which would signify that the storage element is in a valid state, i.e., holds valid data. At the same time, if the parity storage element is in an invalid phase, the incoming data is also stored into the parity storage element.

A subsequent incoming data transfer into a second storage element can cause the storage element to store the new data into the second storage element and transition the corresponding bit to a value of "1." The subsequent data transfer can also cause a "read-modify-write" operation on the data stored in the parity storage element, so that the parity storage element accumulates parity information for the new incoming data. During the "read-modify-write operation," the data in the parity storage element is retrieved and an XOR operation is performed between the stored data and the new incoming data. Mathematically this can be expressed as Value[i]=Value[i−1]^Data[i], where "i" is the number of times a new data transfer has been received while the parity storage element is in a valid state. The read-modify-operation can be executed for the parity storage element every time there is new incoming data for a particular storage element.

Once the storage controller has moved the data into the non-volatile storage device, for example, storage 122, the storage controller resets the phase bit to "0" again, which signifies an invalid state. Selecting D[n] to serve as the parity storage element is arbitrary. Those skilled in the art would understand that any of the D[0]-D[n−1] can serve as the parity storage element. Different rows of storage elements can have the parity storage element in different positions such that the aggregate traffic seen by a column is balanced.

Figure 3A:
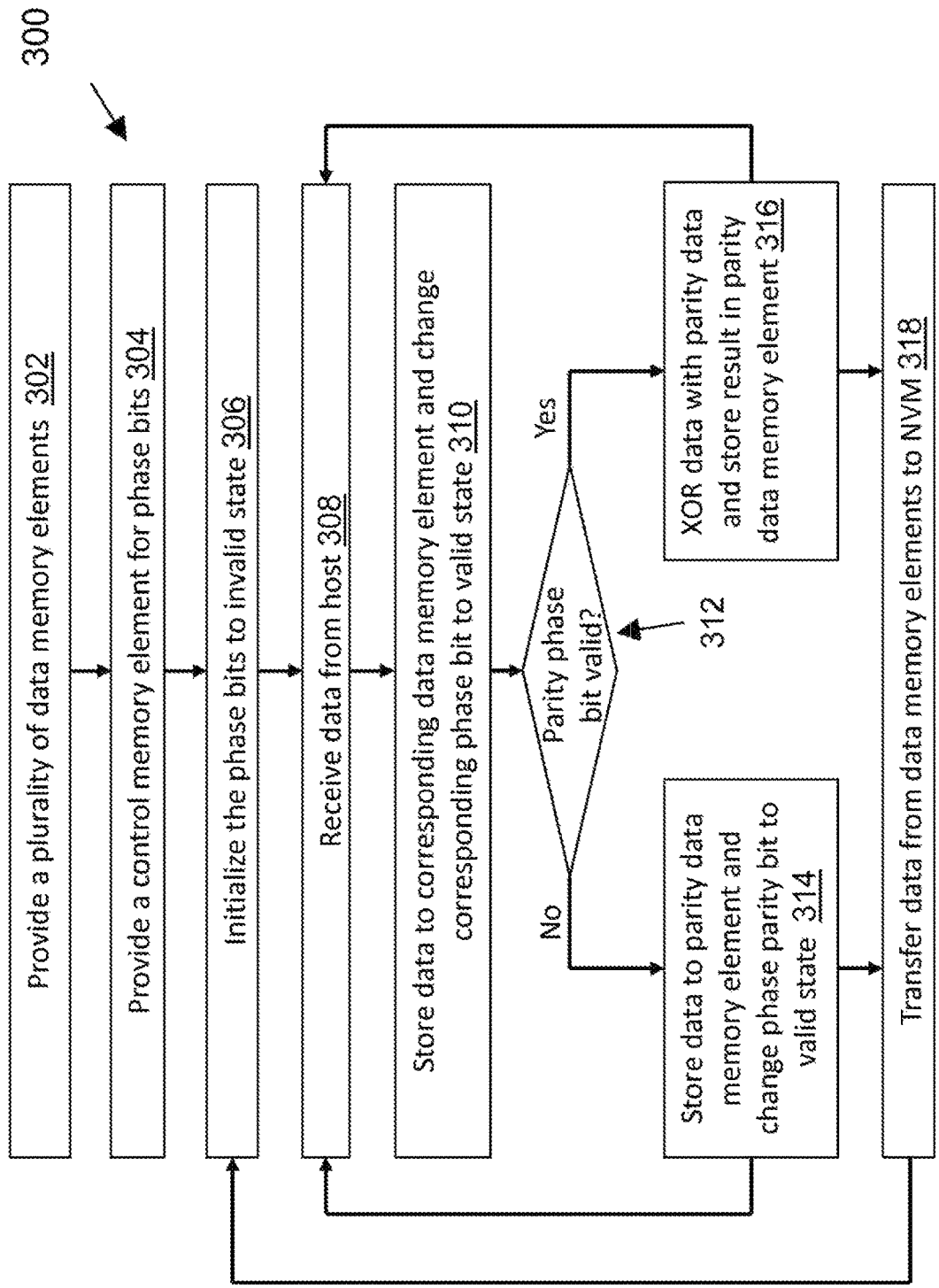
FIGS. 3A and 3B illustrate exemplary methods for introducing redundancy in a memory controller.

The method discussed above is illustrated in FIG. 3A. Specifically, a method for introducing redundancy in a storage controller is shown generally in 300. The method provides a plurality of data memory elements (302) and a control memory element to store phase bits (304). Next, the phase bits are initialized to an invalid state (306), for example, a logical zero state. As data is received from the host (308), it is stored into the corresponding data memory element and the corresponding phase bit is changed to hold a valid state (310), for example, a logical one. When new data is received and stored into the corresponding data memory element, the parity phase bit is checked (312). If the parity phase bit is in an invalid state, then the received data is stored into the parity data memory element and the parity phase bit is changed to hold a valid state (314). If the parity bit is in a valid state, then an XOR operation is performed between the received data and the data in the parity data memory element, and the result is stored into the parity data memory element (316). In either case, the method can continue to receive data from host or can transfer the data stored in the data memory elements to the non-volatile memory (318). Once the data is transferred, the phase bits are initialized to an invalid state (306).

Figure 3B:
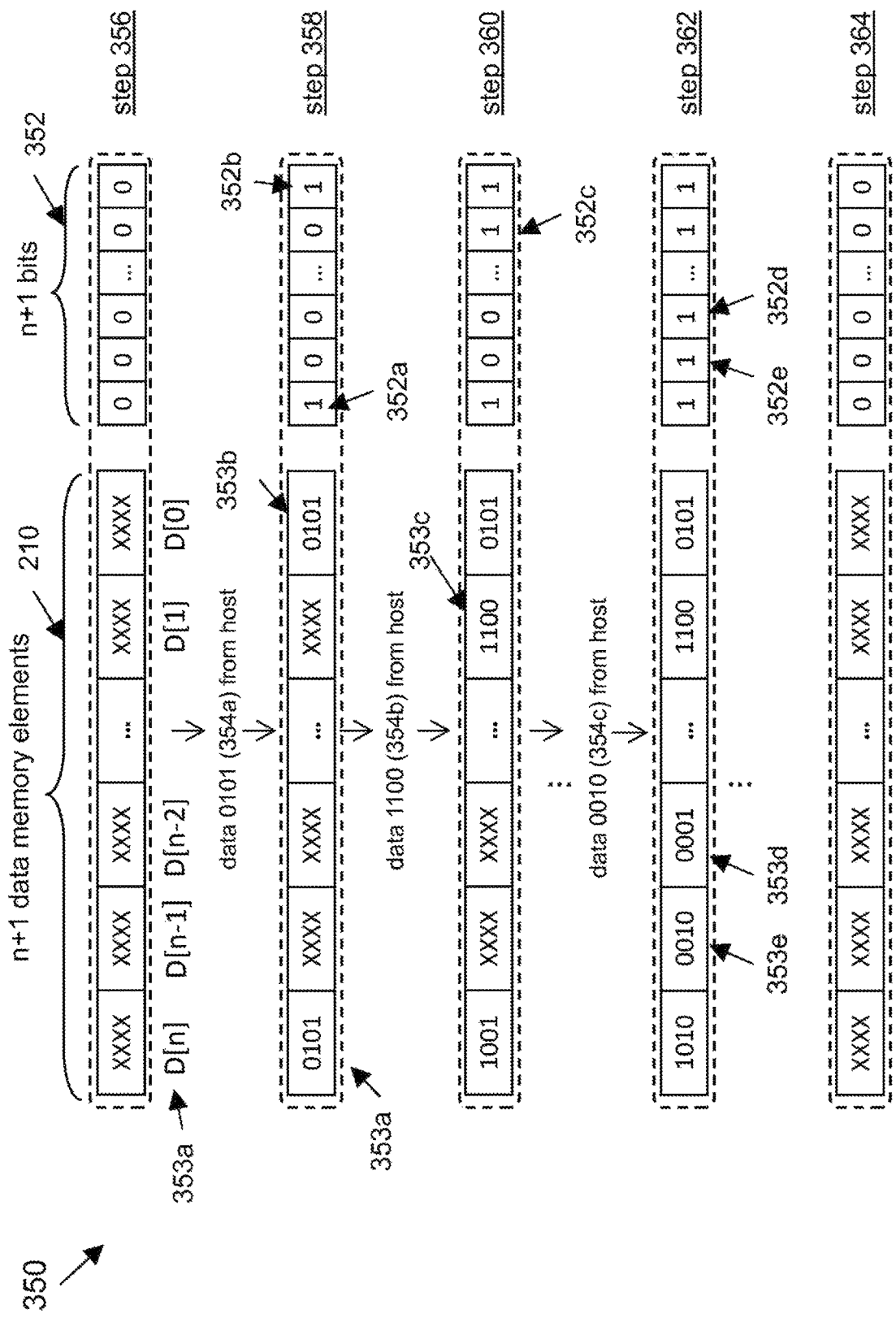

The method is also illustrated with a numerical example in FIG. 3B, generally at 350. Specifically, FIG. 3B shows data memory elements, for example, memory blocks 210, and phase bits 352. In the illustrated example, there are "n+1" data memory elements (210), including a parity data memory element, D[n] (353a), and "n+1" phase bits (352). As explained above, there is a corresponding phase bit for each data memory element. In the illustrated example, the data memory elements are shown as four-bit data blocks, but the present disclosure is not limited to four-bit data blocks and can be applied to any size data block. Initially, the phase bits 352 are all at an invalid state, for example, a logical zero (step 356). As data arrives from the host (354), the data is stored into data memory elements 210 and the corresponding phase bit 352 changes to a valid state. Specifically, in the illustrated example, data block "0101" (354a) arrives from the host and is stored at D[0] 353b (step 358). The corresponding phase bit 352b also changes from a logical zero to a logical one to indicate that D[0] 353b is in a valid state, i.e., holds valid data. The phase bit 352a that corresponds to the parity data memory element D[n] 353a is checked and because, before the new data block arrived phase bit 352a stored a logical zero value, the received data "0101" 354a is also stored in the parity data memory element, D[n] 353a. In addition, the phase bit corresponding to the parity data memory element 352a is changed to hold a logical one value.

When new data block "1100" 354b arrives from the host, it can be stored at D[1] 353c (step 360). The phase bit 352c that corresponds to D[1] 353c changes from a logical zero value to a logical one value (step 360) to indicate that D[1] 353c is in a valid state. The phase bit 352a of the parity data memory element is checked. Because it holds a logical one value, a read-modify-write is executed to store the new parity information. Specifically, the new parity information is the result of an XOR logical operation between the data stored in the parity data memory element "0101" 353a and the received data "1100" 354b. Accordingly, the new parity information "1001" is stored into the parity data memory element D[n] 353a. If at any point, the data stored in any data memory element is lost or corrupted, it can be retrieved using the parity information. For example, if the data stored in D[0] 353b was corrupted, it can be restored using the data stored in the remaining data storage elements in a valid state, including the parity data memory element D[n] 353a. In this case, the information in D[0] 353b can be restored by XOR-ing the data in D[1] 353c and the parity information, i.e., value stored in parity data memory element D[n] 353a. Specifically, the result of an XOR operation between "1100" and "1001" would be "0101," which corresponds to the correct data in D[0] 353b.

As new data is received, it is stored in the data memory elements 210 and the parity information is updated for every received data. For example, all data memory elements 210 can hold data received from the host (step 362). FIG. 3B shows that data memory elements D[n−2] 353d and D[n−1] 353e store values of "0001" and "0010," respectively. When the data is transferred to the non-volatile memory, the phase bits 352 are initialized to an invalid state (step 364) and the entire process can start again.

According to alternatives embodiments, the storage elements are always in a valid state and no phase bit is used. The storage elements are initialized to hold a zero value "0." All incoming data transfers into the storage elements can cause the storage elements to perform a "read-modify-write" operation. The read-modify-write operation is performed for the parity storage element each time there is an incoming data transfer, so that the parity storage element can accumulate parity information for the incoming data. The initial read-modify-operation will perform an XOR operation between "0" and the incoming data. The result of the operation is identical to the incoming data. Accordingly, the incoming data will be stored into the storage element. The read-modify-operation can be executed every time there is new incoming data for the particular storage element. Once the storage controller has moved the data into the non-volatile storage device, for example, storage 122, the storage controller clears the contents of the storage elements, i.e., zeroes their contents, which is equivalent to the phase bit being invalid, as described in the previous embodiment. Zeroing the contents of the storage elements has an associated operation latency and power consumption. However, this implementation does not require storage and maintenance of the phase bits, so the overall memory requirement is less compared to the implementation of the previous embodiment.

Figure 4A:
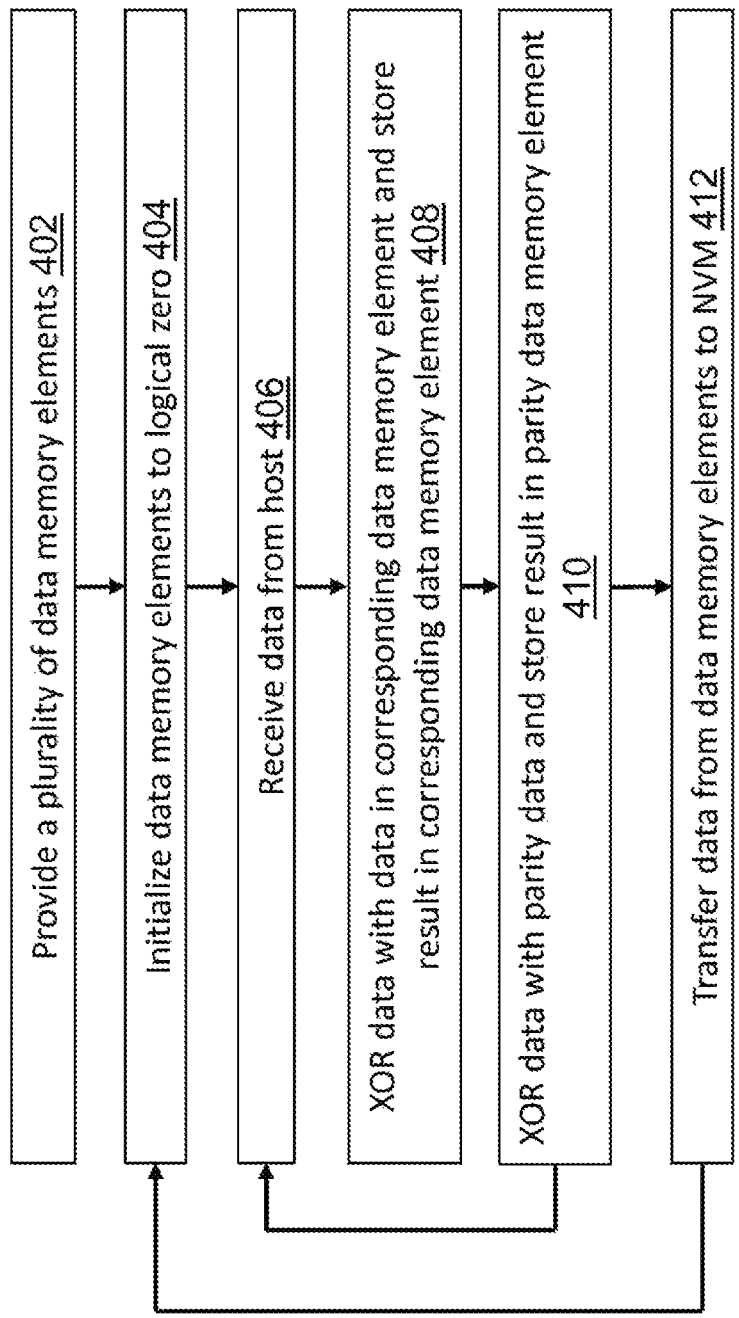
FIGS. 4A and 4B illustrate exemplary methods for introducing redundancy in a memory controller.

The method discussed above is illustrated in FIG. 4A. Specifically, a method for introducing redundancy in a storage controller is shown generally in 400. The method provides a plurality of data memory elements (402) and initializes the data memory elements to a logical zero (404). As data is received from the host (406), an XOR operation is performed between the received data and the data in the corresponding data memory element, and the result is stored into the corresponding data memory element (408). In addition, an XOR operation is performed between the received data and the data in the parity data memory element, and the result is stored into the parity data memory element (410). The method can continue to receive data from host or can transfer the data stored in the data memory elements to the non-volatile memory (412). Once the data is transferred, the data memory elements are initialized to a logical zero (404).

Figure 4B:
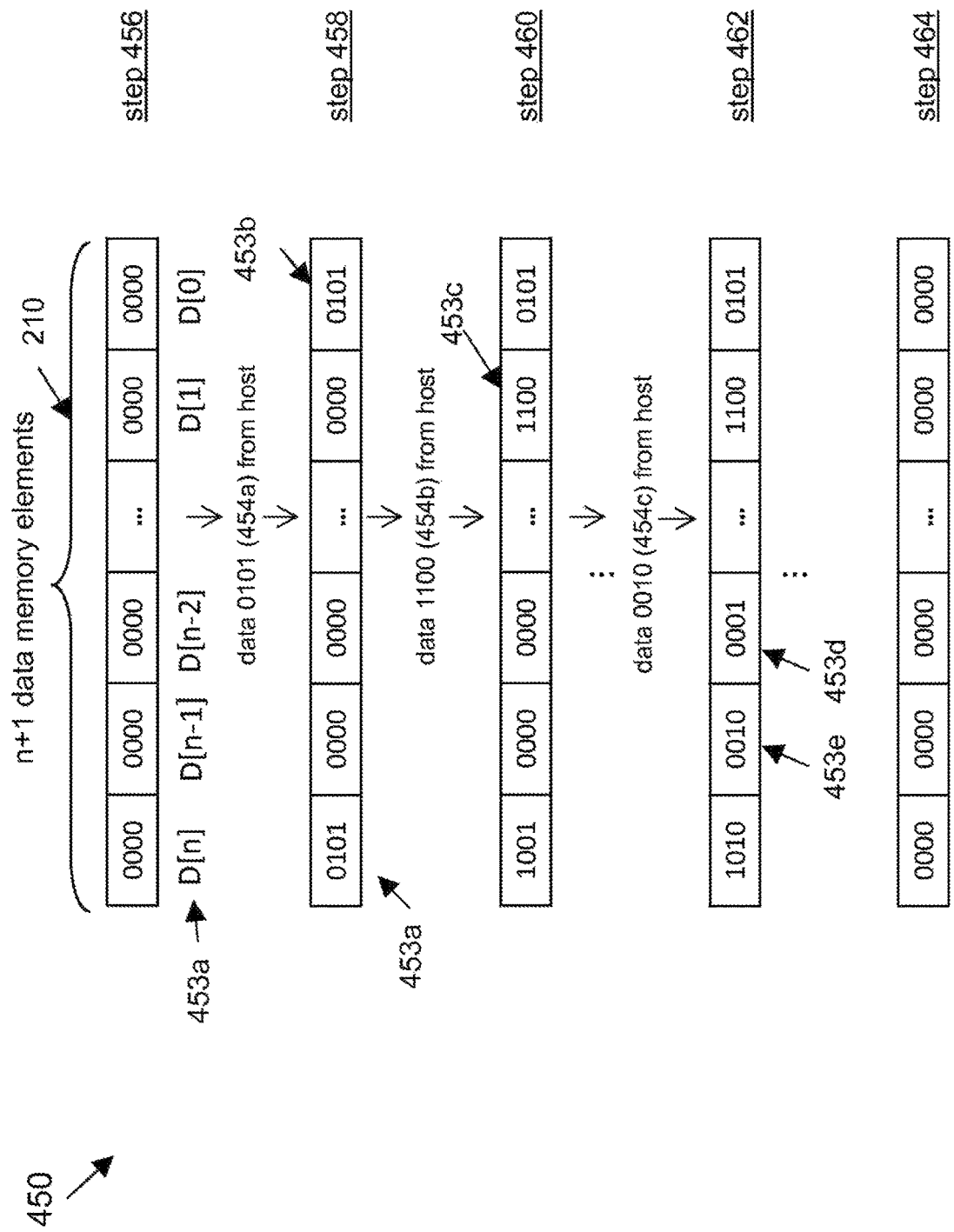

The method is also illustrated with a numerical example in FIG. 4B, generally at 450. Specifically, FIG. 4B shows "n+1" data memory elements, for example, memory blocks 210, including a parity data memory element, D[n] 453a, however, there are no phase bits. In the illustrated example, the data memory elements 210 are shown as four-bit data blocks, but the present disclosure is not limited to four-bit data blocks and can be applied to any size data block. The data memory elements 210 are all initialized to a logical zero value "0000" (step 456). As data (454) arrives from the host, a first read-modify-write operation is executed to store the new data into a data memory element and a second read-modify-write operation is executed to accumulate the parity information in the parity data memory element. Specifically, the result of a first XOR operation between the stored value "0000" in a data memory element, e.g., D[0] 453b, and the received data block "0101" 454a is stored into the data memory element, e.g., D[0] 453b (step 458). In addition, the result of a second XOR operation between the stored value "0000" in the parity data memory element, D[n] 453a, and the received data block "0101" 454a is stored into the parity data memory element, D[n] 453a (step 458).

When new data block "1100" 454b arrives from the host, a first read-modify-write operation is executed to store the new data into a data memory element and a second read-modify-write operation is executed to accumulate the parity information in the parity data memory element. Specifically, the result of a first XOR operation between the stored value "0000" in a data memory element, e.g., D[1] 453c, and the received data block "1100" 454b is stored into the data memory element, e.g., D[1] 453c (step 460). The result of a second XOR operation between the stored value "0101" in the parity data memory element, D[n] 453a, and the received data block "1100" 454b is stored into the parity data memory element, D[n] 453a (step 460). If at any point, the data stored in any data memory element is lost or corrupted, it can be retrieved using the parity information. For example, if the data stored in D[0] 453b was corrupted, it can be restored using the data stored in the remaining data storage elements, including the parity data memory element D[n] 453a. In this case, the information in D[0] 453b can be restored by XOR-ing the data in D[1] 453c and the parity information stored in the parity data memory element, D[n] 453a. Specifically, the result of an XOR operation between "1100" and "1001" would be "0101," which corresponds to the correct data in D[0] 453b. Those of ordinary skill would understand that data memory elements that hold a logical zero value, e.g., "0000" have no effect in the result of the XOR operation.

As new data is received, read-modify-write operations are performed as described above and the parity information is updated for every received data. For example, all data memory elements can hold data received from the host (step 462). FIG. 3B shows that data memory elements D[n-2] 453d and D[n-1] 453e store values of "0001" and "0010," respectively. When the data is transferred to the non-volatile memory, the data memory elements are initialized to a logical zero state (step 464) and the entire process can start again.

In both implementations described above, the storage controller is able to receive multiple interleaved write requests and correctly handle generation of parity bits without requiring ordering among the request or an initialization phase that resets all bits to zero. This solves the problems of (a) Incremental Construction (b) Concurrent Transfers and (c) Buffered Construction, described above, before the eventual write to the non-volatile memory. For example, the disclosed systems can use multi-ported SRAM blocks in an FPGA that perform either copying of the incoming data into the memory (invalid state) or performing a read-modify-write XOR operation of incoming data with the present data (valid state).

According to aspects of the present disclosure, the disclosed systems and methods provide robustness against sudden power loss by guaranteeing that data transfer among controller storage elements are atomic against power loss. For example, the storage controller can guarantee that once a transfer between controller storage elements has initiated, it is always completed, for example, by using a backup power circuitry present in the target device in case of a power failure. Accordingly, the power-safe data transfers can also ensure that there is no partial update or corruption of the parity bits.

As discussed above, it is desirable to know which data transfers have contributed to the accumulated parity, i.e., which storage elements hold valid data. According to aspects of the present disclosure, a parity bit vector, for example, an XOR bit vector, is defined and each contributing data transfer is assigned a bit position in a bit vector. When a particular data transfer completes, the corresponding bit is set in the parity bit vector. The parity bit vector is stored along with the data as well as the parity blocks in NVM. On recovery from a power loss event, the parity bit vector is available to reconstruct the data from the valid parity and data bits. If under alternative implementations, the memory elements are zeroed, then there is no requirement to know which storage elements hold valid data. Accordingly, there is no requirement for a parity bit vector. If however, under a particular implementation, only the memory elements holding valid data are zeroed, then it is desirable to know which memory elements hold valid data, because only those elements contribute to the parity information.

As further discussed above, the parity storage element receives more data traffic compared to the data storage elements. According to aspects of the present disclosure, to prevent the skew in data bandwidth distribution, the location of the parity bits for each subsequent data row is rotated. This ensures that in aggregate each controller storage element receives uniform traffic.

Those of skill in the art would appreciate that the various illustrations in the specification and drawings described herein can be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware, software, or a combination depends upon the particular application and design constraints imposed on the overall system. Skilled artisans can implement the described functionality in varying ways for each particular application. Various components and blocks can be arranged differently (for example, arranged in a different order, or partitioned in a different way) all without departing from the scope of the subject technology.

Furthermore, an implementation of the communication protocol can be realized in a centralized fashion in one computer system, or in a distributed fashion where different elements are spread across several interconnected computer systems. Any kind of computer system, or other apparatus adapted for carrying out the methods described herein, is suited to perform the functions described herein.

A typical combination of hardware and software could be a general purpose computer system with a computer program that, when being loaded and executed, controls the computer system such that it carries out the methods described herein. The methods for the communications protocol can also be embedded in a computer program product, which comprises all the features enabling the implementation of the methods described herein, and which, when loaded in a computer system is able to carry out these methods.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Significantly, this communications protocol can be embodied in other specific forms without departing from the spirit or essential attributes thereof, and accordingly, reference should be had to the following claims, rather than to the foregoing specification, as indicating the scope of the invention.

The communications protocol has been described in detail with specific reference to these illustrated embodiments. It will be apparent, however, that various modifications and changes can be made within the spirit and scope of the disclosure as described in the foregoing specification, and such modifications and changes are to be considered equivalents and part of this disclosure.

What is claimed is:

1. A method for one or more memory controllers, the method comprising:
   receiving a first data;
   storing the first data into a first data memory element, wherein data memory elements comprise the first data memory element and a parity data memory element;
   changing a first phase bit corresponding to the first data memory element;
   assessing a second phase bit corresponding to the parity data memory element;
   when the second phase bit is in an invalid state, storing the first data into the parity data memory element; and
   when the second phase bit is in a valid state,
      performing a logical operation between the first data and data in the parity data memory element, to produce a first result; and
      storing the first result into the parity data memory element.

2. The method of claim 1, wherein:
   changing the first phase bit comprises changing the first phase bit corresponding to the first data memory element, from the invalid state to the valid state; and
   when the second phase bit is determined to be in the invalid state, changing the second phase bit from the invalid state to the valid state.

3. The method of claim 1, wherein data of the first data memory element is restorable from one or more data of the data memory elements in the valid state and data stored in the parity data memory element.

4. The method of claim 1, wherein the logical operation to produce the first result is an exclusive OR logical operation.

5. The method of claim 1, wherein data is stored into the parity data memory element incrementally.

6. The method of claim 1, comprising:
   transferring the stored first data from the first data memory element to a corresponding first storage element; and
   initializing the first and second phase bits to the invalid state.

7. The method of claim 6, wherein the corresponding first storage element is a non-volatile memory located in an independent media unit.

8. The method of claim 1, wherein:
   the data memory elements comprise a first row of data memory elements and a second row of data memory elements;
   the first row of data memory elements comprises the parity data memory element;
   the second row of data memory elements comprises a second parity data memory element;
   the parity data memory element is in a first position of the first row of data memory elements;
   the second parity data memory elements is in a second position of the second row of data memory elements;
   the parity data memory element and the second parity data memory element are in different positions; and
   the first position is different from the second position.

9. A storage system, comprising:
   data memory elements, comprising a first data memory element and a parity data memory element; and
   one or more controllers configured to cause:
      receiving a first data;
      storing the first data into the first data memory element;
      changing a first phase bit corresponding to the first data memory element;
      assessing a second phase bit corresponding to the parity data memory element;
      when the second phase bit is in an invalid state, storing the first data into the parity data memory element; and
      when the second phase bit is in a valid state,
         performing a logical operation between the first data and data in the parity data memory element, to produce a first result; and
         storing the first result into the parity data memory element.

10. The storage system of claim 9, wherein:
    changing the first phase bit comprises changing the first phase bit corresponding to the first data memory element, from the invalid state to the valid state; and
    when the second phase bit is determined to be in the invalid state, changing the second phase bit from the invalid state to the valid state.

11. The storage system of claim 9, wherein data of the first data memory element is restorable from one or more data of the data memory elements in the valid state and data stored in the parity data memory element.

12. The storage system of claim 9, wherein the logical operation to produce the first result is an exclusive OR logical operation.

13. The storage system of claim 9, wherein data is caused to be stored into the parity data memory element incrementally.

14. The storage system of claim 9, wherein the one or more controllers are configured to cause:
    transferring the stored first data from the first data memory element to a corresponding first storage element; and
    initializing the first and second phase bits to the invalid state.

15. The storage system of claim 14, wherein the corresponding first storage element is a non-volatile memory located in a device separate from the one or more controllers.

16. The storage system of claim 9, wherein:
    the data memory elements comprise a first row of data memory elements and a second row of data memory elements;

the first row of data memory elements comprises the parity data memory element;
the second row of data memory elements comprises a second parity data memory element;
the parity data memory element is in a first position of the first row of data memory elements;
the second parity data memory elements is in a second position of the second row of data memory elements;
the parity data memory element and the second parity data memory element are in different positions; and
the first position is different from the second position.

17. An apparatus, comprising:
data memory elements, comprising a first data memory element and a parity data memory element;
means for receiving a first data;
means for storing the first data into the first data memory element;
means for changing a first phase bit corresponding to the first data memory element;
means for assessing a second phase bit corresponding to the parity data memory element;
when the second phase bit is in an invalid state, means for storing the first data into the parity data memory element; and
when the second phase bit is in a valid state,
    means for performing a logical operation between the first data and data in the parity data memory element, to produce a first result; and
    means for storing the first result into the parity data memory element.

18. The apparatus of claim 17, wherein:
the means for changing the first phase bit comprises means for changing the first phase bit corresponding to the first data memory element, from the invalid state to the valid state; and
when the second phase bit is determined to be in the invalid state, the apparatus comprises means for changing the second phase bit from the invalid state to the valid state.

19. The apparatus of claim 17, wherein data of the first data memory element is restorable from one or more data of the data memory elements in the valid state and data stored in the parity data memory element.

20. The apparatus of claim 17, wherein:
the data memory elements comprise a first row of data memory elements and a second row of data memory elements;
the first row of data memory elements comprises the parity data memory element;
the second row of data memory elements comprises a second parity data memory element;
the parity data memory element is in a first position of the first row of data memory elements;
the second parity data memory elements is in a second position of the second row of data memory elements;
the parity data memory element and the second parity data memory element are in different positions; and
the first position is different from the second position.

* * * * *